US008987590B2

(12) United States Patent
Bojarczuk et al.

(10) Patent No.: US 8,987,590 B2
(45) Date of Patent: Mar. 24, 2015

(54) THIN FILM SOLAR CELLS

(75) Inventors: Nestor A. Bojarczuk, Poughkeepsie, NY (US); Keith E. Fogel, Hopewell Junction, NY (US); Supratik Guha, Chappaqua, NY (US); Byungha Shin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 13/564,244

(22) Filed: Aug. 1, 2012

(65) Prior Publication Data

US 2014/0038344 A1 Feb. 6, 2014

(51) Int. Cl.
| | |
|---|---|
| *H01L 31/00* | (2006.01) |
| *H01L 31/0224* | (2006.01) |
| *H01L 31/032* | (2006.01) |
| *H01L 31/0392* | (2006.01) |
| *H01L 31/073* | (2012.01) |

(52) U.S. Cl.
CPC .... *H01L 31/0326* (2013.01); *H01L 31/022466* (2013.01); *H01L 31/0392* (2013.01); *H01L 31/03925* (2013.01); *H01L 31/073* (2013.01); *Y02E 10/543* (2013.01)
USPC ...................................................... 136/265

(58) Field of Classification Search
USPC ...................................................... 136/265
See application file for complete search history.

(56) References Cited

U.S. PATENT DOCUMENTS

2012/0199191 A1    8/2012  Lim

FOREIGN PATENT DOCUMENTS

| WO | 2010135622 A1 | 11/2010 |
|---|---|---|
| WO | 2011053077 A2 | 5/2011 |

OTHER PUBLICATIONS

Minemoto et al., "Layer Transfer of Cu(ln,Ga)Se2 Thin-Film to Alternative Substrate and Application to Solar Cells", IEEE, 2009, pp. 206-209.
Negami et al., "Production technology for CIGS thin film solar cells", Thin Solid Films 403-404 (2002), pp. 197-203.
Marron et al., "Lift-off process and rear-side characterization of CuGaSe2 chalcopyrite thin films and solar cells", Journal of Applied Physics 97, 094915, published online Apr. 22, 2005, p. 1-7, (2005).
Minemoto et al., "Lift-off Process for Flexible Cu(ln,Ga)Se2 Solar Cells", Japanese Journal of Physics 49 04DP06, published online Apr. 20, 2010, p. 1-3, (2010).

*Primary Examiner* — David Vu
(74) *Attorney, Agent, or Firm* — Cantor Colburn LLP; Vazken Alexanian (57) ABSTRACT

Embodiments relate to a method including forming a layer of copper zinc tin sulfide (CZTS) on a first layer of molybdenum (Mo) and annealing the CZTS layer and the first Mo layer to form a layer of molybdenum disulfide ($MoS_2$) between the layer of CZTS and the first layer of Mo. The method includes forming a back contact on a first surface of the CZTS layer opposite the first Mo layer and separating the first Mo layer and the $MoS_2$ layer from the CZTS layer to expose a second surface of the CZTS layer opposite the first surface. The method further includes forming a buffer layer on the second surface of the CZTS layer.

20 Claims, 9 Drawing Sheets

THIN FILM SOLAR CELLS

BACKGROUND

The present disclosure relates to thin film solar cells, and in particular to omitting a $MoS_2$ layer in thin film solar cells.

Solar cells are photovoltaic devices that convert sunlight directly into electrical power. Generally, p-n junction based photovoltaic cells include a layer of an n-type semiconductor in direct contact with a layer of a p-type semiconductor. When a p-type semiconductor is positioned in intimate contact with an n-type semiconductor, a diffusion of electrons occurs from the region of high electron concentration (the n-type side of the junction) into the region of low electron concentration (the p-type side of the junction). However, the diffusion of charge carriers (electrons) does not happen indefinitely, as an opposing electric field is created by this charge imbalance. The electric field established across the p-n junction induces a separation of charge carriers that are created as result of photon absorption.

The most common type of solar cell material is silicon, which is in the form of single or polycrystalline wafers. However, the cost of electricity generated using silicon-based solar cells is still higher than the cost of electricity generated by the more traditional methods. Since the early 1970's there has been an effort to reduce cost of solar cells for terrestrial use. One way of reducing the cost of solar cells is to develop low-cost, thin-film growth techniques that can deposit solar cell quality absorber materials on large area substrates and to fabricate these devices using high-throughput, low-cost methods.

The increased interest in thin-film photovoltaics has been due primarily to improvements in conversion efficiency of cells made at the laboratory scale, with the anticipation that manufacturing costs can be significantly reduced compared to the older and more expensive crystalline and polycrystalline silicon technology. The term "thin-film" is thus used to distinguish this type of solar cell from the more common silicon based cell, which uses a relatively thick silicon wafer. While single crystal silicon cells still demonstrate the best conversion efficiency to date at over 20%, thin-film cells have been produced which can perform close to this level. As such, performance of the thin-film cells is no longer the major issue that limits their commercial use. Instead, primary factors now driving the commercialization of thin-film solar cells include cost, manufacturability, reliability and throughput, for example.

SUMMARY

Exemplary embodiments include a method including forming a layer of copper zinc tin sulfide (CZTS) on a first layer of molybdenum (Mo) and annealing the CZTS layer and the first Mo layer to form a layer of molybdenum disulfide ($MoS_2$) between the layer of CZTS and the first layer of Mo. The method includes forming a back contact on a first surface of the CZTS layer opposite the first Mo layer and separating the first Mo layer and the $MoS_2$ layer from the CZTS layer to expose a second surface of the CZTS layer opposite the first surface. The method further includes forming a buffer layer on the second surface of the CZTS layer.

Additional exemplary embodiments include a method including forming a first layer of molybdenum (Mo), forming an absorber layer including zinc and sulfur on the first Mo layer, and annealing the first Mo layer and the absorber layer to form a molybdenum disulfide ($MoS_2$) layer between the first Mo layer and the absorber layer. The method includes forming a back contact on a first surface of the absorber layer opposite the first Mo layer and separating the first Mo layer from the absorber layer to expose a second surface of the absorber layer opposite the first surface. The method further includes forming a buffer layer on the second surface of the absorber layer.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

FIGS. 2-13 illustrate a method of fabricating a solar cell structure according to embodiments of the present disclosure;

DETAILED DESCRIPTION $Cu_2ZnSnS_4$ (CZTS) is an emerging material for solar cell absorbers since it is relatively inexpensive, earth-abundant, and non-toxic. A common back-contact for CZTS is molybdenum (Mo). However, in a post-deposition annealing process, bonds between the CZTS layer and the Mo layer may be weakened due, at least in part, to the formation of a molybdenum sulfide ($MoS_2$) layer. Also unwanted secondary phases such zinc sulfide (ZnS) often form at a boundary of the CZTS layer and the $MoS_2$ layer during the post-deposition annealing. The weakening of the bond may lead to a decrease in efficiency in the final thin film solar cell. In exemplary embodiments of the present disclosure, a solar cell structure is formed by annealing an absorber layer including copper, zinc, tin, and sulfur with a molybdenum (Mo) layer, separating the Mo layer and a by-product molybdenum disulfide ($MoS_2$) layer from the absorber layer, and forming a back contact layer on the annealed absorber layer.

Figure 1:
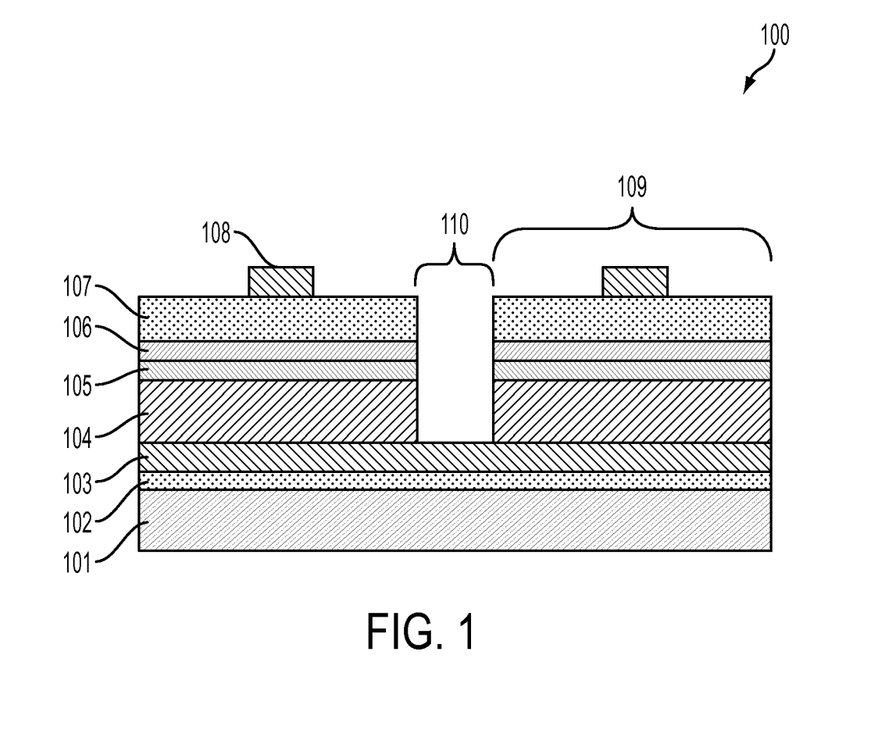
FIG. 1 illustrates a solar cell structure according to one embodiment of the present disclosure.

FIG. 1 illustrates a solar cell structure 100 according to an embodiment of the disclosure. The solar cell structure includes a substrate 101, a conducting epoxy glue 102 on the substrate 101, and a molybdenum (Mo) contact 103 on the conducting epoxy glue 102. In one embodiment, the substrate 101 is a flexible material, such as a metal foil or a polymer film. In one embodiment, the Mo contact 103 is non-annealed.

The solar cell structure 100 further includes an absorber layer 104 formed on the Mo contact 103, a first buffer layer 105 formed on the absorber layer 104, and a second buffer layer 106 formed on the first buffer layer 105. The absorber layer 104 may include zinc and sulfur, and in particular, in one embodiment, the absorber layer 104 is copper zinc tin sulfide ($Cu_2ZnSnS_4$ or CZTS). In one embodiment, the first buffer layer 105 is cadmium sulfide (CdS) and the second buffer layer 106 is intrinsic zinc oxide (i-ZnO). As discussed below, the solar cell structure 100 may be fabricated such that no molybdenum disulfide ($MoS_2$) layer exists between the Mo contact 103 and the absorber layer 104. In addition, as discussed below, the solar cell structure 100 may be fabricated such that no zinc sulfide (ZnS) exists between the Mo contact 103 and the absorber layer 104.

The first buffer layer 105 may have a thickness between 40 nm (nanometers) and 100 nm, and in particular the first buffer layer 105 may have a thickness between 60-70 nm. The second buffer layer 106 may have a thickness between 50 nm and 130 nm, and in particular the second buffer layer 106 may have a thickness between 80-100 nm.

The solar cell structure 100 further includes a transparent conducting oxide (TCO) layer 107. Electrodes 108 may be formed on the TCO layer 107. The TCO layer 107 may include, for example, a mixture including aluminum and zinc oxide (Al:ZnO) or a mixture including indium tin and oxygen (ITO). The electrodes 108 may comprise any conductive material, such as nickel (Ni), aluminum (Al), or copper (Cu).

The solar cell structure 100 may include a plurality of solar cell devices 109 separated by a space 110, where each solar cell device 109 is connected to a separate electrode 108.

FIGS. 2-13 describe a process of fabricating the solar cell structure 100 according to one embodiment.

Figure 2:
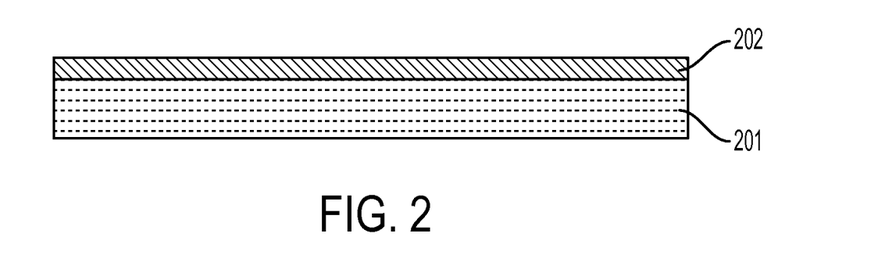
FIG. 2 illustrates forming a molybdenum (Mo) layer on a substrate according to an embodiment.

In FIG. 2, a substrate 201 is provided, and a molybdenum (Mo) layer 202 is formed on the substrate 201. The substrate 201 may comprise soda-lime glass, for example, and may have a thickness between 1-3 mm (millimeters) thick. The Mo layer 202 may be formed by a sputtering process and may have a thickness between 600 nm (nanometers) to 1 μm (micron) thick.

Figure 3:
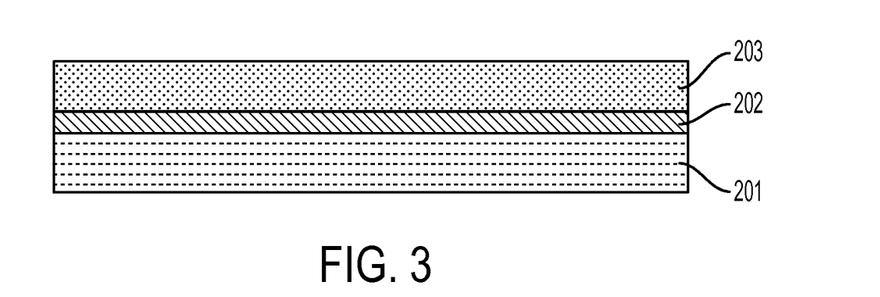
FIG. 3 illustrates forming an absorber layer according to an embodiment.

In FIG. 3, a preliminary absorber layer 203 is formed on the Mo layer 202. The preliminary absorber layer 203 may be formed, for example, by depositing elements or chemicals including zinc (Zn) and sulfur (S) onto the Mo layer 202. In one embodiment, the preliminary absorber layer 203 is formed by depositing elements or chemicals including copper (Cu), zinc, tin (Sn) and sulfur onto the Mo layer 202. In another embodiment, the preliminary absorber layer 203 is formed by depositing elements or chemicals including copper, zinc, tin, sulfur and selenium (Se) onto the Mo layer 202. The deposition may be performed by physical vapor deposition (PVD) or by any other process of depositing a plurality of elements or chemicals onto the Mo layer 202.

Figure 4:
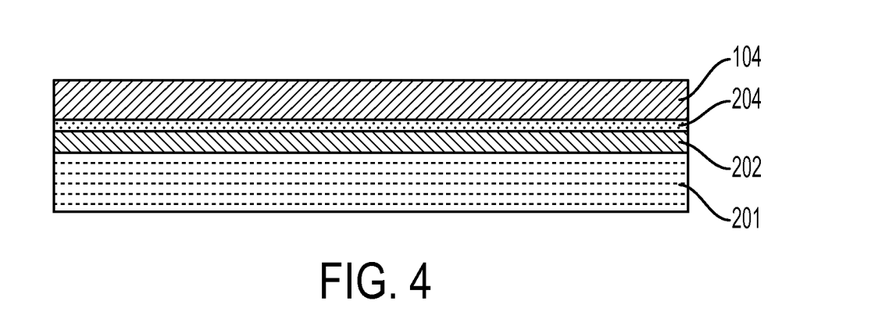
FIG. 4 illustrates annealing according to an embodiment.
Figure 5:
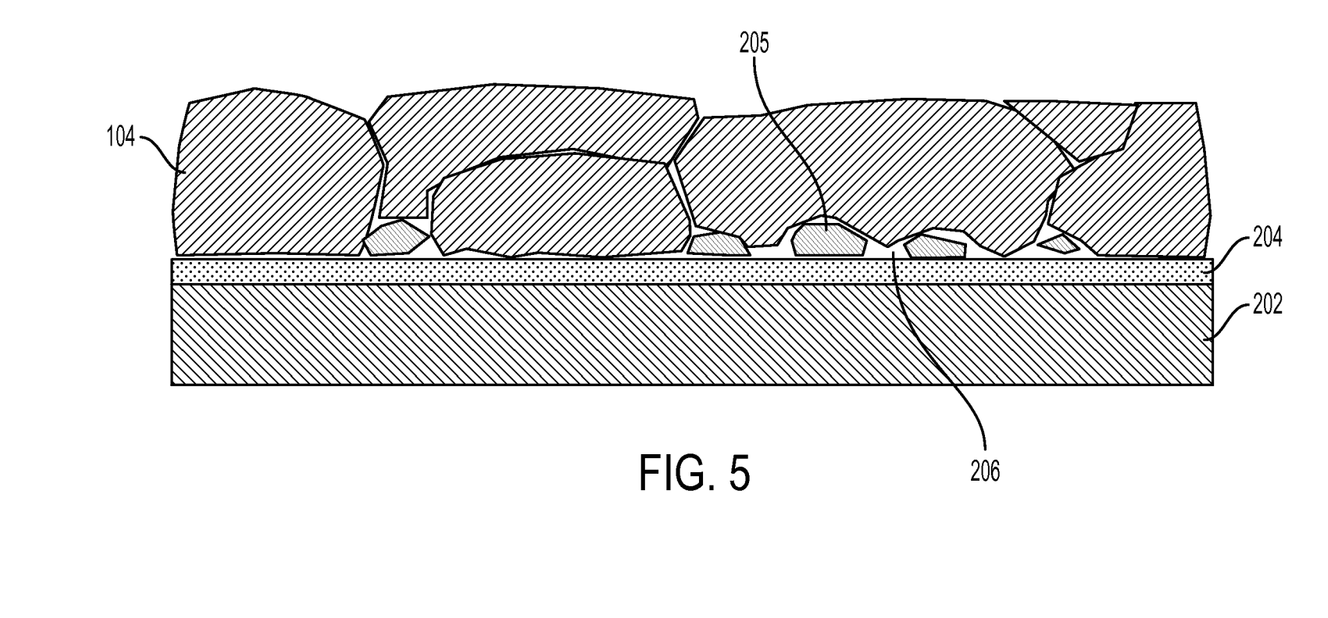
FIG. 5 illustrates an example of a magnified cross-section of an annealed preliminary solar cell structure according to an embodiment.

FIG. 4 illustrates annealing the layers of FIG. 3 to form an annealed device. The annealing of the preliminary absorber layer 203 results in the formation of an annealed absorber layer 104 and a by-product layer of molybdenum disulfide ($MoS_2$) 204 between the absorber layer 203 and the Mo layer 202. The annealing is performed at a high temperature, such as at a temperature of 500 degrees Celsius or greater, for between 3 and 8 minutes, such as for 5 minutes. FIG. 5 illustrates an example of a magnified cross-section of the absorber layer 104 and the Mo layer 202 after annealing according to one embodiment.

In embodiments in which the absorber layer 104 includes zinc and sulfur, and particularly when the absorber layer 104 comprises CZTS, the interfacial bonding between the absorber layer 104 and the Mo layer 202 may be weakened by the annealing.

In particular, sulfur is a highly active compound and reacts with Mo to form the $MoS_2$ layer 204 between the absorber layer 104 and the Mo layer 202. The $MoS_2$ layer 204 may have a weak interfacial bond with the absorber layer 104. In addition, zinc sulfide (ZnS) may form as a result of the annealing and may localize at the border of the absorber layer 104 adjacent to the $MoS_2$ layer 204. The ZnS 205 reduces the efficiency of the final solar cell device. As a result of one or more of the formation of the $MoS_2$ layer 204 and the ZnS 205, voids 206 may form between the absorber layer 104 and the $MoS_2$ layer 204, weakening the bond between the $MoS_2$ layer 204 and the absorber layer 104 and reducing the efficiency of the final solar cell device. As discussed below, embodiments of the present disclosure utilize the weak bond between the $MoS_2$ layer 204 and the absorber layer 104 to remove the $MoS_2$ layer 204 and improve the efficiency of the solar cell device.

Figure 6:
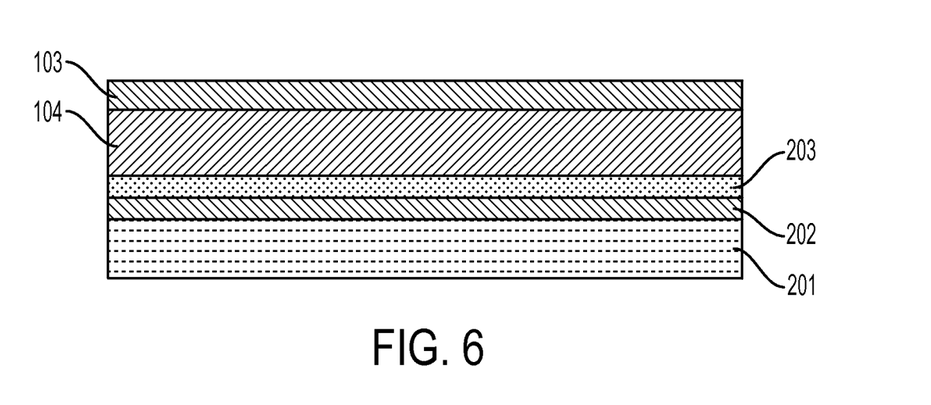
FIG. 6 illustrates forming an Mo contact layer according to an embodiment.

FIG. 6 illustrates forming a Mo contact layer 103 on the absorber layer 104. In the final solar cell device, the Mo contact layer 103 may act as a bottom contact of the device. The Mo contact layer 103 may be formed by deposition, such as by PVD or by any other appropriate deposition process.

Figure 7:
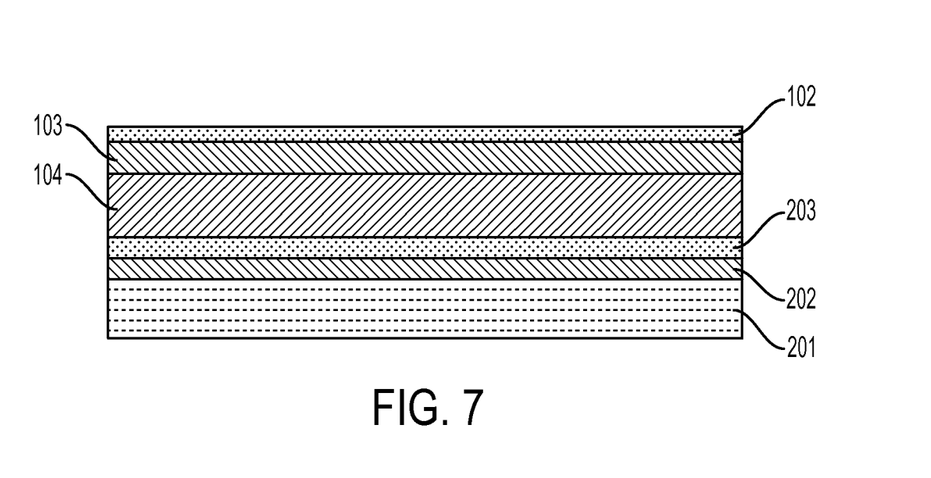
FIG. 7 illustrates forming an epoxy layer according to an embodiment.
Figure 8:
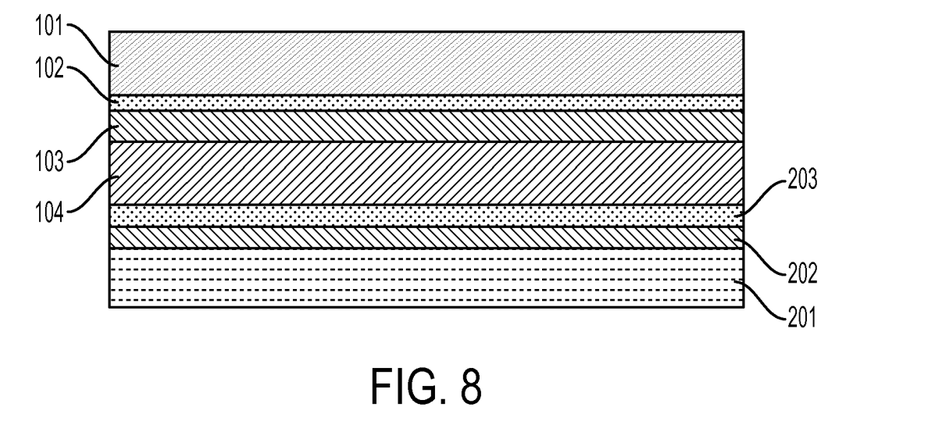
FIG. 8 illustrates applying a substrate to the epoxy layer according to an embodiment.

FIG. 7 illustrates applying a conductive epoxy glue 102 on the Mo contact layer 103. FIG. 8 illustrates applying a substrate 101 to the conductive epoxy glue 102. In one embodiment, the substrate 101 is a flexible substrate, such as a metal foil or a polymer film. The application of a flexible substrate is made possible by applying the substrate 101 to the sample that has been already annealed, i.e., no need for annealing after the application of the flexible substrate.

Figure 9:
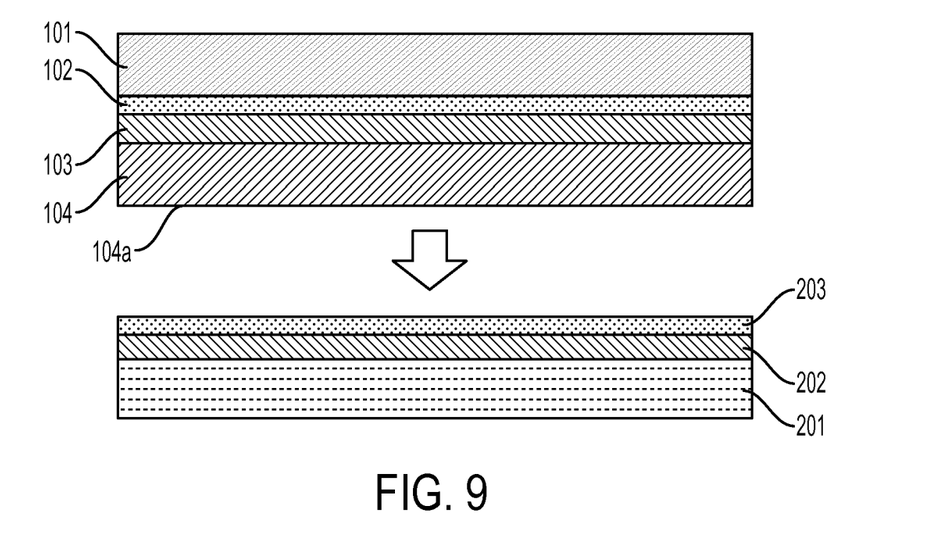
FIG. 9 illustrates separating the absorber layer from a molybdenum disulfide ($MoS_2$) layer according to an embodiment.

In FIG. 9, the absorber 104 is separated from the $MoS_2$ layer 204. In one embodiment, the absorber 104 may be separated by applying a tensile strain to the substrate 101, which may be made of a flexible material, to lift the substrate 101, epoxy glue 102, Mo contact layer 103 and absorber 104 off from the $MoS_2$ layer 204, the Mo layer 202, and the lime-glass substrate 201.

In one embodiment, the absorber 104 may be etched after separating the absorber 104 from the $MoS_2$ layer 204 to remove any ZnS formed on the absorber 104. In particular, an etching formula, such as hydrochloride (HCl) may be applied to an exposed surface 104a of the absorber 104 to eliminate the ZnS.

Figure 10:
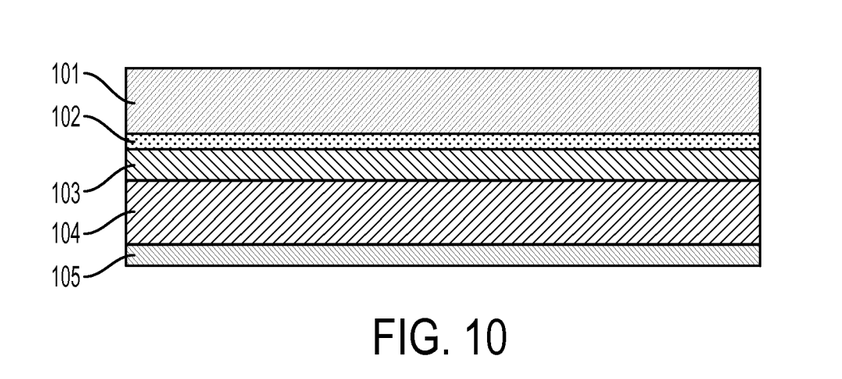
FIG. 10 illustrates forming a buffer layer according to an embodiment.

FIG. 10 illustrates forming a first buffer layer 105 on the absorber 104. In one embodiment, the first buffer layer 105 comprises cadmium sulfide (CdS). The first buffer layer 105 may be between 40-90 nm thick, and in particular the first buffer layer 105 may be between 60-70 nm thick. The first buffer layer 105 may be formed by deposition, such as by CBD, PVD or by any other chemical deposition process.

Figure 11:
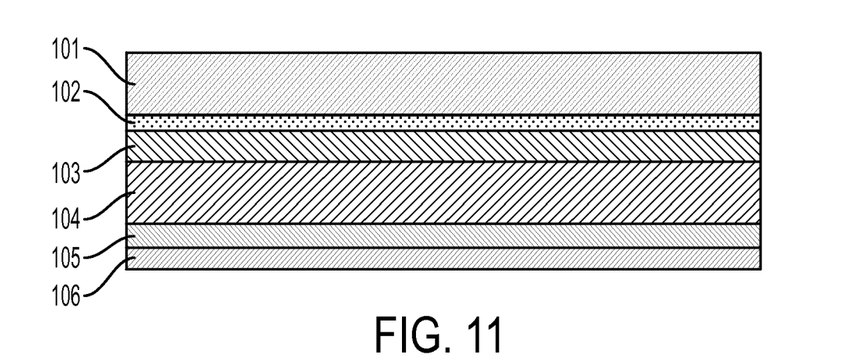
FIG. 11 illustrates forming a zinc oxide (ZnO) layer according to an embodiment.

FIG. 11 illustrates forming a second buffer layer 106 on the first buffer layer 106. In one embodiment, the second buffer layer is intrinsic zinc oxide (i-ZnO). The second buffer layer 106 may be between 60-120 nm thick, and in particular the second buffer layer 106 may be between 80-100 nm thick. The second buffer layer 106 may be formed by deposition, such as by CBD, PVD or by any other chemical deposition process.

Figure 12:
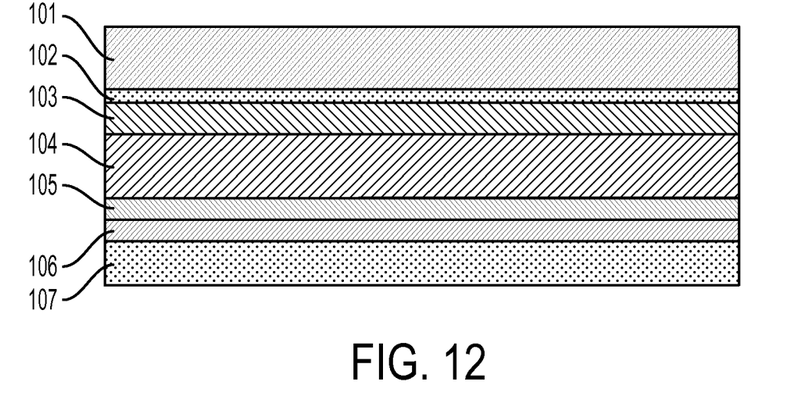
FIG. 12 illustrates forming a transparent conducting oxide (TCO) according to an embodiment.

FIG. 12 illustrates forming a transparent conductive oxide (TCO) layer 107 on the second buffer layer 106. In one embodiment, the TCO layer 107 comprises a combination of aluminum and zinc oxide (Al:ZnO) and in another embodiment, the TCO layer 107 comprises a mixture or solution including indium, tin, and oxygen (ITO). The TCO layer 107 may be formed by sputtering, or by any other deposition process.

Figure 13:
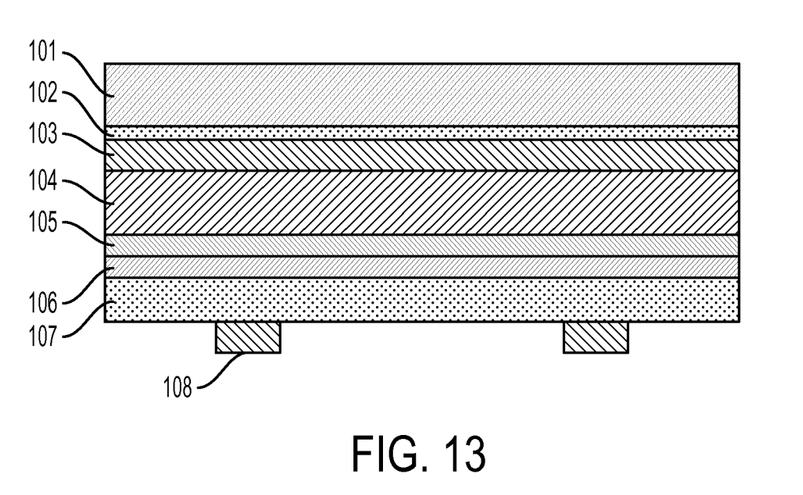
FIG. 13 illustrates forming electrodes on the TCO according to an embodiment.

FIG. 13 illustrates forming electrodes 108 on the TCO layer 107. The electrodes 108 are conductive materials, such as metals. In one embodiment, the electrodes 108 comprise nickel (Ni) or aluminum (Al). The electrodes 108 may be formed by masking, lithography, or any other process for forming conductive materials on a substrate.

Figure 14:
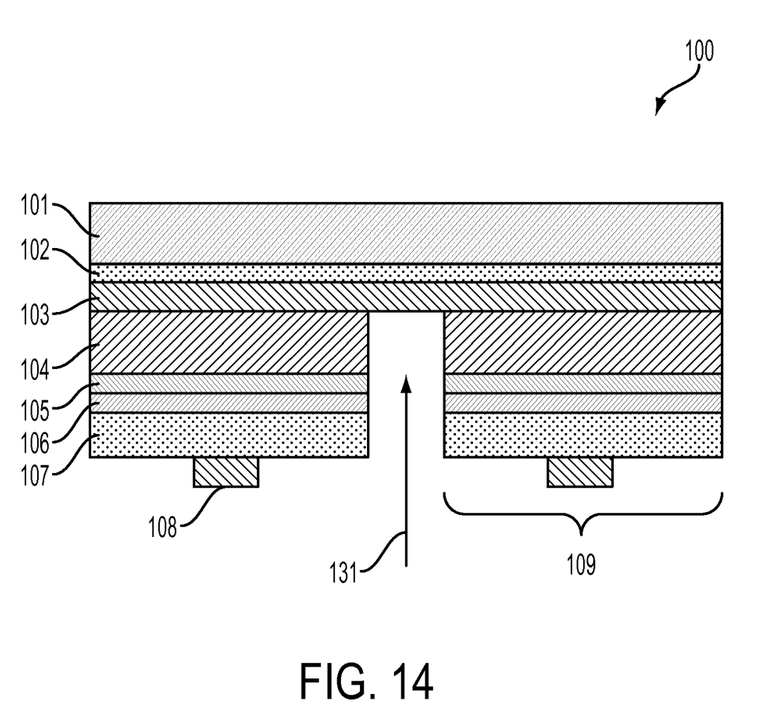
FIG. 14 illustrates separating solar cell devices according to one embodiment.

FIG. 14 illustrates separating the solar cell structure 100 into a plurality of separate solar cell devices 109. The separation may be performed by mechanical or laser scribing, represented by the arrow 131, or by any other desired process for removing layers from a substrate.

According to the above embodiments, a solar cell structure may be formed having improved efficiency by removing a $MoS_2$ layer from the structure. The efficiency may be further improved by removing ZnS from the structure which may form during an annealing process. The $MoS_2$ layer may be removed by applying a Mo contact layer to an annealed absorber layer, applying a substrate to the Mo contact layer, and applying a force to the substrate to separate the $MoS_2$ layer from the absorber layer. The substrate may be a flexible material, resulting in a solar cell device having improved flexibility as well as efficiency. While some technical benefits of the present disclosure have been described, it is understood that embodiments of the present disclosure may realize additional technical benefits. In addition, embodiments of the present disclosure encompass variations in order of processes, variations in materials and variations in types of processes performed.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While a preferred embodiment to the disclosure has been described, it will be understood that those skilled in the art, both now and in the future, may make various improvements and enhancements which fall within the scope of the claims which follow. These claims should be construed to maintain the proper protection for the disclosure first described.

What is claimed is:

1. A method, comprising:
    forming a layer of copper zinc tin sulfide (CZTS) on a first layer of molybdenum (Mo);
    annealing the CZTS layer and the first Mo layer to form a layer of molybdenum disulfide ($MoS_2$) between the layer of CZTS and the first layer of Mo;
    forming a back contact on a first surface of the CZTS layer opposite the first Mo layer;
    separating the first Mo layer and the $MoS_2$ layer from the CZTS layer to expose a second surface of the CZTS layer opposite the first surface; and
    forming a buffer layer on the second surface of the CZTS layer.

2. The method of claim 1, wherein separating the first Mo layer and the $MoS_2$ layer from the CZTS layer comprises:
    forming a conducting epoxy on the back contact;
    applying a substrate to the conducting epoxy; and
    applying a tensile force to the substrate to pull the $MoS_2$ layer away from the CZTS layer.

3. The method of claim 2, wherein the substrate is a flexible substrate.

4. The method of claim 3, wherein the substrate is one of a metal foil and a polymer film.

5. The method of claim 1, further comprising:
    etching the second surface of the CZTS layer to remove zinc sulfide (ZnS) formed by the annealing.

6. The method of claim 5, wherein the etching is performed using hydrochloride (HCl).

7. The method of claim 1, wherein the CZTS and first Mo layers are annealed at a temperature greater than 500 degrees Celsius.

8. The method of claim 1, wherein the back contact is a second Mo layer.

9. The method of claim 1, further comprising:
    forming a transparent conducting oxide (TCO) layer on the buffer layer.

10. The method of claim 9, wherein the TCO layer comprises at least one of a mixture including aluminum and zinc oxide (Al:ZnO) and a mixture including indium, tin, and oxygen (ITO).

11. The method of claim 1, wherein the first Mo layer is coated on a soda-lime glass substrate by sputtering, and
    separating the first Mo layer and $MoS_2$ layer from the CZTS layer includes separating the soda-lime glass substrate from the CZTS layer.

12. The method of claim 1, wherein the copper, tin, zinc and sulfur are deposited on the first Mo layer by thermal evaporation.

13. A method, comprising:
    forming a first layer of molybdenum (Mo);
    forming an absorber layer including zinc and sulfur on the first Mo layer;
    annealing the first Mo layer and the absorber layer to form a molybdenum disulfide ($MoS_2$) layer between the first Mo layer and the absorber layer;

forming a back contact on a first surface of the absorber layer opposite the first Mo layer;

separating the first Mo layer from the absorber layer to expose a second surface of the absorber layer opposite the first surface; and forming a buffer layer on the second surface of the absorber layer.

14. The method of claim 13, wherein the absorber layer comprises copper zinc tin sulfide (CZTS).

15. The method of claim 13, wherein the back contact is a second Mo layer.

16. The method of claim 13, wherein the buffer layer is cadmium sulfide (CdS).

17. The method of claim 13, further comprising:
forming a transparent conducting oxide (TCO) on the buffer layer.

18. The method of claim 17, wherein the TCO comprises at least one of a mixture including aluminum and zinc oxide (Al—ZnO) and a mixture including indium, tin, and oxygen (ITO).

19. The method of claim 17, wherein the buffer layer has a thickness between 60-70 nm (nanometers) and the TCO has a thickness between 80-100 nm.

20. The method of claim 13, further comprising:
etching the second surface of the absorber layer to remove zinc sulfide (ZnS) formed by the annealing.

* * * * *